(12) United States Patent
Chiu et al.

(10) Patent No.: US 9,985,645 B2
(45) Date of Patent: May 29, 2018

(54) TECHNIQUES FOR IMPROVING MISMATCH SHAPING OF DYNAMIC ELEMENT MATCHING CIRCUIT WITHIN DELTA-SIGMA MODULATOR

(71) Applicant: MEDIATEK INC., Hsin-Chu (TW)

(72) Inventors: Pao-Cheng Chiu, New Taipei (TW); Hung-Yi Hsieh, Hsinchu County (TW)

(73) Assignee: MEDIATEK INC., Hsin-Chu (TW)

( * ) Notice: Subject to any disclaimer, the term of this patent is extended or adjusted under 35 U.S.C. 154(b) by 0 days. days.

(21) Appl. No.: 15/652,252

(22) Filed: Jul. 18, 2017

(65) Prior Publication Data

US 2018/0048326 A1    Feb. 15, 2018

Related U.S. Application Data

(60) Provisional application No. 62/374,925, filed on Aug. 15, 2016.

(51) Int. Cl.
*H03M 3/00* (2006.01)

(52) U.S. Cl.
CPC .......... *H03M 3/322* (2013.01); *H03M 3/422* (2013.01); *H03M 3/436* (2013.01); *H03M 3/458* (2013.01)

(58) Field of Classification Search
CPC ...... H03M 3/322; H03M 3/458; H03M 3/436; H03M 3/422
USPC .................................................. 341/120, 143
See application file for complete search history.

(56) References Cited

U.S. PATENT DOCUMENTS

| 7,391,351 | B2 * | 6/2008 | Pertijs ................... | H03M 3/334 |
| | | | | 341/143 |
| 7,982,648 | B2 * | 7/2011 | Chen ................... | H03M 1/0665 |
| | | | | 341/143 |
| 9,287,887 | B2 * | 3/2016 | Obata ................. | H03M 1/0665 |
| 9,729,166 | B1 * | 8/2017 | Tsang ................... | H03M 3/422 |

OTHER PUBLICATIONS

Witte, "A 72dB-DR Delta-Sigma CT Modulator Using Digitally Estimated Auxiliary DAC Linearization Achieving 88fJ/conv in a 25MHz BW", 2012 IEEE International Solid-State Circuits Conference.

* cited by examiner

*Primary Examiner* — Brian Young
(74) *Attorney, Agent, or Firm* — Winston Hsu

(57) ABSTRACT

A delta-sigma modulator includes a receiving circuit, a loop filter, a quantizer, a dynamic element matching circuit and a digital to analog converter. The receiving circuit is arranged for receiving a feedback signal and an input signal to generate a summation signal. The loop filter is arranged for receiving the summation signal to generate a filtered summation signal. The quantizer is arranged for generating a digital output signal according to the filtered summation signal. The dynamic element matching circuit is arranged for receiving the digital output signal to generate a shaped digital output signal for shaping element mismatch. The digital to analog converter is arranged for performing a digital to analog converting operation upon a signal derived from the shaped digital output signal to generate the feedback signal to the receiving circuit, wherein clock signals used by the quantizer and the dynamic element matching circuit have different frequencies.

17 Claims, 3 Drawing Sheets

TECHNIQUES FOR IMPROVING MISMATCH SHAPING OF DYNAMIC ELEMENT MATCHING CIRCUIT WITHIN DELTA-SIGMA MODULATOR

CROSS REFERENCE TO RELATED APPLICATIONS

This application claims the priority of U.S. Provisional Application No. 62/374,925, filed on Aug. 15, 2016, which is included herein by reference in its entirety.

BACKGROUND

Because a clock speed is limited by semiconductor process, and a wider bandwidth and lower power consumption are required in an analog-to-digital converter (ADC), the ADC is preferred to have a lower oversampling ratio (OSR). In addition, in some ADC designs, a multi-level digital-to-analog converter (DAC) is implemented to reduce a quantization noise, however, using the multi-level DAC may induce an element mismatch issue. To improve element mismatch issue, a dynamic element matching (DEM) circuit is positioned before the DAC to shape DAC mismatch to reduce the mismatch error. However, the DEM circuit becomes ineffective when low OSR is applied.

SUMMARY

It is therefore an objective of the present invention to provide a delta-sigma modulator (delta-sigma ADC), whose DEM circuit uses a higher clock rate while the quantizer uses a lower clock rate, to solve the above-mentioned problem.

According to one embodiment of the present invention, a delta-sigma modulator includes a receiving circuit, a loop filter, a quantizer, a dynamic element matching circuit and a digital to analog converter. The receiving circuit is arranged for receiving a feedback signal and an input signal to generate a summation signal. The loop filter is arranged for receiving the summation signal to generate a filtered summation signal. The quantizer is arranged for generating a digital output signal according to the filtered summation signal. The dynamic element matching circuit is arranged for receiving the digital output signal to generate a shaped digital output signal for shaping element mismatch. The digital to analog converter is arranged for performing a digital to analog converting operation upon a signal derived from the shaped digital output signal to generate the feedback signal to the receiving circuit, wherein clock signals used by the quantizer and the dynamic element matching circuit have different frequencies.

According to another embodiment of the present invention, a continuous-time delta-sigma modulator includes a receiving circuit, a loop filter, a quantizer, a dynamic element matching circuit and a digital to analog converter. The receiving circuit is arranged for receiving a feedback signal and an input signal to generate a summation signal. The loop filter is arranged for receiving the summation signal to generate a filtered summation signal. The quantizer is arranged for generating a digital output signal according to the filtered summation signal. The dynamic element matching circuit is arranged for receiving the digital output signal to generate a shaped digital output signal for shaping element mismatch. The digital to analog converter is arranged for performing a digital to analog converting operation upon a signal derived from the shaped digital output signal to generate the feedback signal to the receiving circuit, wherein clock signals used by the quantizer and the dynamic element matching circuit have different frequencies.

According to another embodiment of the present invention, a discrete-time delta-sigma modulator includes a receiving circuit, a loop filter, a quantizer, a dynamic element matching circuit and a digital to analog converter. The receiving circuit is arranged for receiving a feedback signal and an input signal to generate a summation signal. The loop filter is arranged for receiving the summation signal to generate a filtered summation signal. The quantizer is arranged for generating a digital output signal according to the filtered summation signal. The dynamic element matching circuit is arranged for receiving the digital output signal to generate a shaped digital output signal for shaping element mismatch. The digital to analog converter is arranged for performing a digital to analog converting operation upon a signal derived from the shaped digital output signal to generate the feedback signal to the receiving circuit, wherein clock signals used by the quantizer and the dynamic element matching circuit have different frequencies.

These and other objectives of the present invention will no doubt become obvious to those of ordinary skill in the art after reading the following detailed description of the preferred embodiment that is illustrated in the various figures and drawings.

DETAILED DESCRIPTION

Certain terms are used throughout the following description and claims to refer to particular system components. As one skilled in the art will appreciate, manufacturers may refer to a component by different names. This document does not intend to distinguish between components that differ in name but not function. In the following discussion and in the claims, the terms "including" and "comprising" are used in an open-ended fashion, and thus should be interpreted to mean "including, but not limited to . . . ". The terms "couple" and "couples" are intended to mean either an indirect or a direct electrical connection. Thus, if a first device couples to a second device, that connection may be through a direct electrical connection, or through an indirect electrical connection via other devices and connections.

Figure 1:
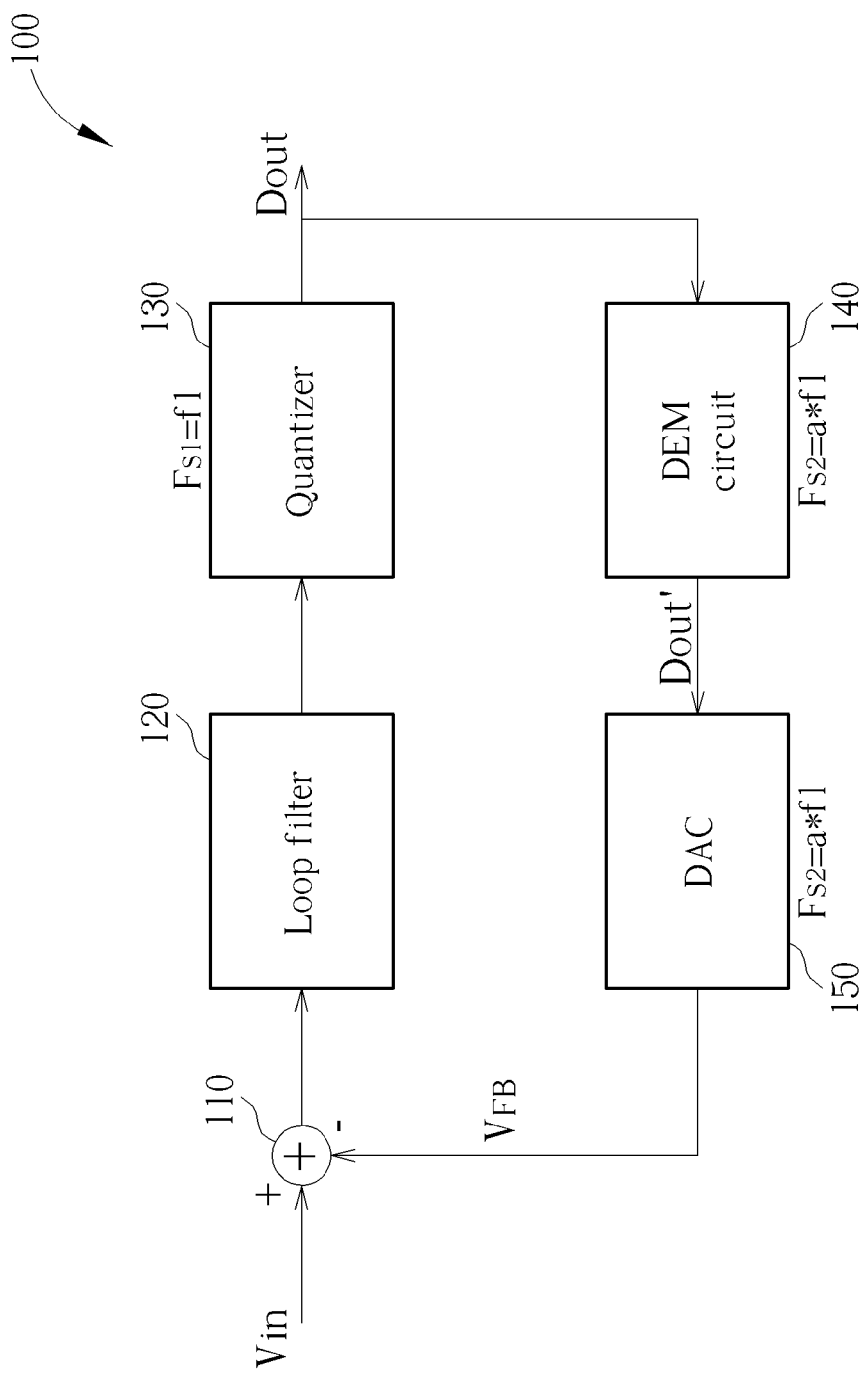
FIG. 1 is a diagram illustrating a continuous-time delta-sigma modulator according to one embodiment of the present invention.

Please refer to FIG. 1, which is a diagram illustrating a continuous-time delta-sigma modulator 100 according to one embodiment of the present invention. As shown in FIG. 1, the continuous-time delta-sigma modulator 100 comprises a receiving circuit 110, a loop filter 120, a quantizer 130, a DEM circuit 140 and a DAC 150. The receiving circuit 110 receives an input signal Vin and a feedback signal $V_{FB}$, and calculates a difference by subtracting the feedback signal $V_{FB}$ by the input signal Vin to generate a summation signal. The loop filter 120 is arranged to filter the summation signal to generate a filtered summation signal. The quantizer 130 is arranged to generate a digital output Dout according to the filtered summation signal. Then, the DEM circuit 140 is arranged to receive the digital output signal Dout to generate a shaped digital output signal Dout' for shaping DAC mismatch. The DAC 150 performs a digital-to-analog converting operation upon the shaped digital output signal Dout' to generate the feedback signal $V_{FB}$ to the receiving circuit 110.

Because the topic of the present invention focuses on the use of the clock signals within the continuous-time delta-sigma modulator 100, and the circuits of the quantizer 130, the DEM circuit 140 and the DAC 150 should be known by a person skilled in the art, detailed circuit structures of the elements within the continuous-time delta-sigma modulator 100 are therefore omitted here.

In the continuous-time delta-sigma modulator 100, a clock signal used by the quantizer 130 has a first frequency (sampling frequency) FS1, and clock signals used by the DEM circuit 140 and the DAC 150 have a second frequency (sampling frequency) FS2 greater than the first frequency FS1. In this embodiment, the first frequency FS1 is "a" times the second frequency FS2, that is FS1=f1 and FS2=a*f1, where "a" may be any suitable integer such as 2, 3 or 4. In this embodiment, By using the slower sampling frequencies to the quantizer 130, a power consumption of the loop filter 120 and the quantizer 130 can be reduced; and by using the faster sampling frequencies to the DEM circuit 140, the DEM circuit 140 can generate the shaped digital output signal Dout' more frequently (i.e. output bit rate of the DEM circuit 140 is faster than the output bit rate of the quantizer 130) to increase the efficiency for shaping DAC mismatch. Therefore, the embodiment shown in FIG. 1 can maintain the efficiency of the DEM circuit 140 while taking care of the power consumption.

Figure 2:
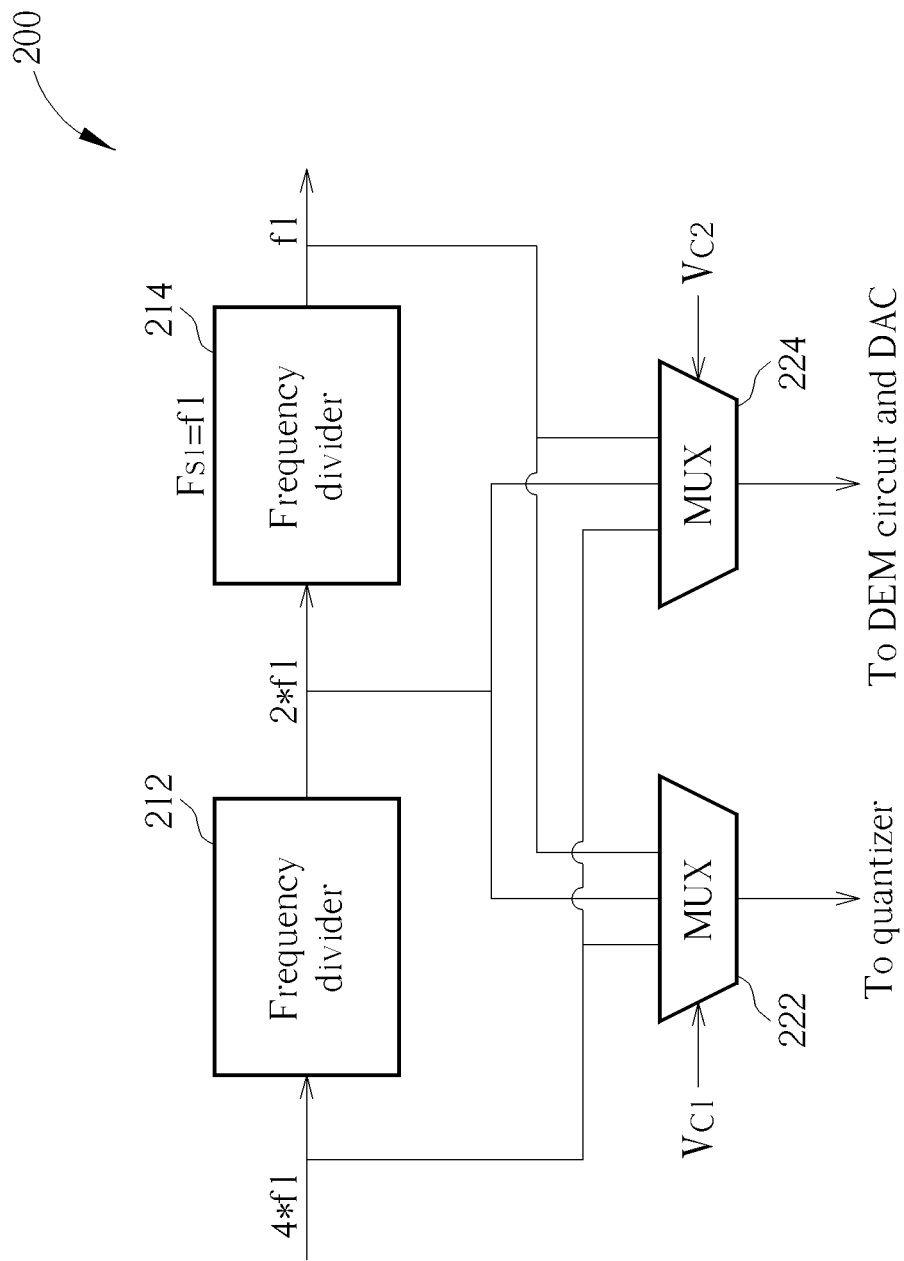
FIG. 2 shows a control circuit for generating clock signals having different frequencies to the quantizer, the DEM circuit and the DAC according to one embodiment of the present invention.

The ratio "a" between the second frequency FS2 and the first frequency FS1 may be programmable or controlled by a processor. FIG. 2 shows a control circuit 200 for generating clock signals having different frequencies to the quantizer 130, the DEM circuit 140 and the DAC 150 according to one embodiment of the present invention. As shown in FIG. 2, the control circuit 200 comprises a plurality of frequency dividers (in this embodiment, there are two frequency dividers 212 and 214 having a divisor "2") and a plurality of multiplexers (in this embodiment, there are two multiplexers 222 and 224). In the operations of the control circuit 200, the frequency divider 212 divides a clock signal having frequency "4*f1" to generate a clock signal having frequency "2*f1", and the frequency divider 214 divides the clock signal having frequency "2*f1" to generate a clock signal having frequency "f1". Then, the multiplexer 222 receives the clock signals having the frequencies "4*f1", "2*f1" and "f1", and generates one of the clock signals (e.g. "f1") to the quantizer 130 according to a control signal VC1, and the multiplexer 224 receives the clock signals having the frequencies "4*f1", "2*f1" and "f1", and generates one of the clock signals (e.g. "2*f1") to the DEM circuit 140 and the DAC 150 according to a control signal VC2.

Figure 3:
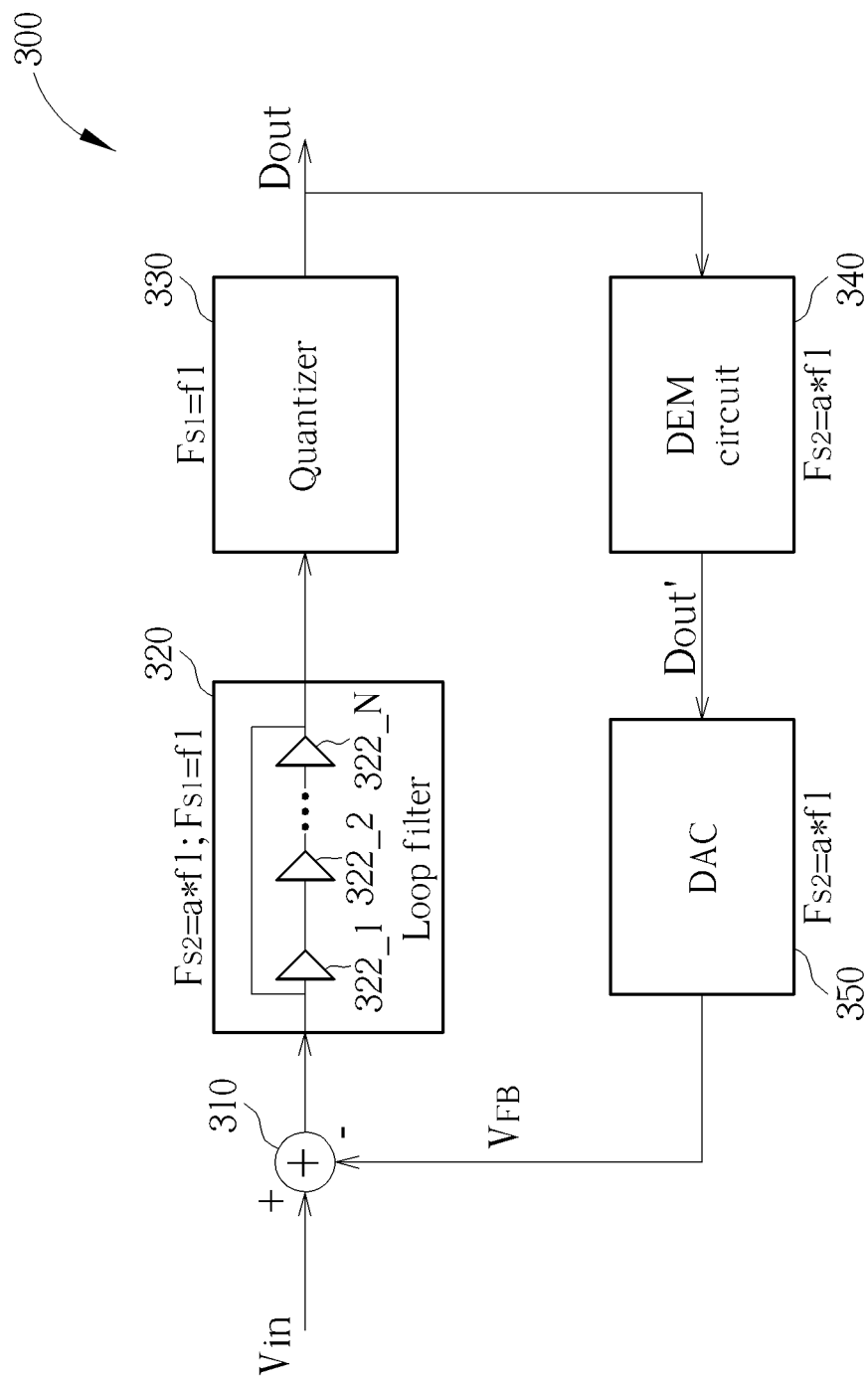
FIG. 3 is a diagram illustrating a discrete-time delta-sigma modulator according to one embodiment of the present invention.

Please refer to FIG. 3, which is a diagram illustrating a discrete-time delta-sigma modulator 300 according to one embodiment of the present invention. As shown in FIG. 3, the discrete-time delta-sigma modulator 300 comprises a receiving circuit 310, a loop filter 320, a quantizer 330, a DEM circuit 340 and a DAC 350, where the loop filter 320 comprises a plurality of amplifying stages 322_1-322_N connected in series. The receiving circuit 310 receives an input signal Vin and a feedback signal $V_{FB}$, and calculates a difference by subtracting the feedback signal $V_{FB}$ by the input signal Vin to generate a summation signal. The loop filter 320 is arranged to filter the summation signal to generate a filtered summation signal. The quantizer 330 is arranged to generate a digital output Dout according to the filtered summation signal. Then, the DEM circuit 340 is arranged to receive the digital output signal Dout to generate a shaped digital output signal Dout' for shaping DAC mismatch. The DAC 350 performs a digital-to-analog converting operation upon the shaped digital output signal Dout' to generate the feedback signal $V_{FB}$ to the receiving circuit 310.

Because the topic of the present invention focuses on the use of the clock signals within the discrete-time delta-sigma modulator 300, and the circuits of the quantizer 330, the DEM circuit 340 and the DAC 350 should be known by a person skilled in the art, detailed circuit structures of the elements within the discrete-time delta-sigma modulator 300 are therefore omitted here.

In the discrete-time delta-sigma modulator 300, a clock signal used by the quantizer 330 has a first frequency (sampling frequency) FS1, and clock signals used by the DEM circuit 340 and the DAC 350 have a second frequency (sampling frequency) FS2 greater than the first frequency FS1. In addition, a portion of the amplifying stages of the loop filter 320 (e.g. at least the first amplifying stage 322_1) uses the clock signal having the second frequency FS2, and the other amplifying stages such as 322_2-322_N uses the clock signal having the first frequency FS1. In this embodiment, the first frequency FS1 is "a" times the second frequency FS2, that is FS1=f1 and FS2=a*f1, where "a" may be any suitable integer such as 2, 3 or 4. In this embodiment, By using the slower sampling frequencies to the quantizer 330, a power consumption of the loop filter 320 and the quantizer 330 can be reduced; and by using the faster sampling frequencies to the DEM circuit 340, the DEM circuit 340 can generate the shaped digital output signal Dout' more frequently (output bit rate of the DEM circuit 340 is faster than the output bit rate of the quantizer 330) to increase the efficiency for shaping DAC mismatch. Therefore, the embodiment shown in FIG. 3 can maintain the efficiency of the DEM circuit 340 while taking care of the power consumption.

The clock signals used by the elements within the discrete-time delta-sigma modulator 300 may be generated by the control circuit 200 shown in FIG. 2. In detail, the quantizer 330 and the amplifying stages 322_2-322_N of the loop filter 320 may use the clock signal outputted by the multiplexer 222, and the DEM circuit 340, the DAC 350 and the first amplifying stage 322_1 of the loop filter 320 may use the clock signal outputted by the multiplexer 224.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:
1. A delta-sigma modulator, comprising:
a receiving circuit, for receiving a feedback signal and an input signal to generate a summation signal;
a loop filter, coupled to the receiving circuit, for receiving the summation signal to generate a filtered summation signal;
a quantizer, coupled to the loop filter, for generating a digital output signal according to the filtered summation signal;

a dynamic element matching circuit, coupled to the quantizer, for receiving the digital output signal to generate a shaped digital output signal for shaping element mismatch; and a digital to analog converter, coupled to the dynamic element matching circuit and the receiving circuit, for performing a digital to analog converting operation upon the shaped digital output signal to generate the feedback signal to the receiving circuit;

wherein clock signals used by the quantizer and the dynamic element matching circuit have different frequencies; and clock signals used by the dynamic element matching circuit and the digital to analog converter have same frequency, and the clock signal used by each of the dynamic element matching circuit and the digital to analog converter has a higher frequency than the clock signal used by the quantizer.

2. The delta-sigma modulator of claim 1, wherein the clock signal used by the quantizer has a first frequency, the clock signals used by the dynamic element matching circuit and the digital to analog converter have a second frequency, and the first frequency is obtained by frequency-dividing the second frequency.

3. The delta-sigma modulator of claim 1, wherein the clock signal used by the quantizer has a first frequency, the clock signals used by the dynamic element matching circuit and the digital to analog converter have a second frequency, and the first frequency and the second frequency are programmable or controlled by a processor.

4. The delta-sigma modulator of claim 1, wherein the delta-sigma modulator is a discrete-time delta-sigma modulator, the clock signal used by the quantizer has a first frequency, the clock signal used by the dynamic element matching circuit has a second frequency higher than the first frequency, and the loop filter uses clock signals have both the first frequency and the second frequency.

5. The delta-sigma modulator of claim 4, wherein the loop filter comprises a plurality of stages, a first stage of the plurality of stages uses the clock signal having the second frequency, and the following stages use the clock signal having the first frequency.

6. A continuous-time delta-sigma modulator, comprising:
a receiving circuit, for receiving a feedback signal and an input signal to generate a summation signal;
a loop filter, coupled to the receiving circuit, for receiving the summation signal to generate a filtered summation signal;
a quantizer, coupled to the loop filter, for generating a digital output signal according to the filtered summation signal;
a dynamic element matching circuit, coupled to the quantizer, for receiving the digital output signal to generate a shaped digital output signal for shaping element mismatch; and
a digital to analog converter, coupled to the dynamic element matching circuit and the receiving circuit, for performing a digital to analog converting operation upon a signal derived from the shaped digital output signal to generate the feedback signal to the receiving circuit;
wherein clock signals used by the quantizer and the dynamic element matching circuit have different frequencies.

7. The continuous-time delta-sigma modulator of claim 6, wherein the clock signal used by the dynamic element matching circuit has a higher frequency than the clock signal used by the quantizer.

8. The continuous-time delta-sigma modulator of claim 6, wherein clock signals used by the dynamic element matching circuit and the digital to analog converter have same frequency, and the clock signal used by each of the dynamic element matching circuit and the digital to analog converter has a higher frequency than the clock signal used by the quantizer.

9. The continuous-time delta-sigma modulator of claim 8, wherein the clock signal used by the quantizer has a first frequency, the clock signals used by the dynamic element matching circuit and the digital to analog converter have a second frequency, and the first frequency is obtained by frequency-dividing the second frequency.

10. The continuous-time delta-sigma modulator of claim 8, wherein the clock signal used by the quantizer has a first frequency, the clock signals used by the dynamic element matching circuit and the digital to analog converter have a second frequency, and the first frequency and the second frequency are programmable or controlled by a processor.

11. A discrete-time delta-sigma modulator, comprising:
a receiving circuit, for receiving a feedback signal and an input signal to generate a summation signal;
a loop filter, coupled to the receiving circuit, for receiving the summation signal to generate a filtered summation signal;
a quantizer, coupled to the loop filter, for generating a digital output signal according to the filtered summation signal;
a dynamic element matching circuit, coupled to the quantizer, for receiving the digital output signal to generate a shaped digital output signal for shaping element mismatch; and
a digital to analog converter, coupled to the dynamic element matching circuit and the receiving circuit, for performing a digital to analog converting operation upon a signal derived from the shaped digital output signal to generate the feedback signal to the receiving circuit;
wherein clock signals used by the quantizer and the dynamic element matching circuit have different frequencies.

12. The discrete-time delta-sigma modulator of claim 11, wherein the clock signal used by the dynamic element matching circuit has a higher frequency than the clock signal used by the quantizer.

13. The discrete-time delta-sigma modulator of claim 11, wherein clock signals used by the dynamic element matching circuit and the digital to analog converter have same frequency, and the clock signal used by each of the dynamic element matching circuit and the digital to analog converter has a higher frequency than the clock signal used by the quantizer.

14. The discrete-time delta-sigma modulator of claim 11, wherein the clock signal used by the quantizer has a first frequency, the clock signal used by the dynamic element matching circuit has a second frequency higher than the first frequency, and the loop filter uses clock signals have both the first frequency and the second frequency.

15. The discrete-time delta-sigma modulator of claim 14, wherein the loop filter comprises a plurality of stages, at least a first stage of the plurality of stages uses the clock signal having the second frequency, and the other stages use the clock signal having the first frequency.

16. A delta-sigma modulator, comprising:
a receiving circuit, for receiving a feedback signal and an input signal to generate a summation signal;

a loop filter, coupled to the receiving circuit, for receiving the summation signal to generate a filtered summation signal;

a quantizer, coupled to the loop filter, for generating a digital output signal according to the filtered summation signal;

a dynamic element matching circuit, coupled to the quantizer, for receiving the digital output signal to generate a shaped digital output signal for shaping element mismatch; and a digital to analog converter, coupled to the dynamic element matching circuit and the receiving circuit, for performing a digital to analog converting operation upon the shaped digital output signal to generate the feedback signal to the receiving circuit;

wherein clock signals used by the quantizer and the dynamic element matching circuit have different frequencies;

wherein the delta-sigma modulator is a discrete-time delta-sigma modulator, the clock signal used by the quantizer has a first frequency, the clock signal used by the dynamic element matching circuit has a second frequency higher than the first frequency, and the loop filter uses clock signals have both the first frequency and the second frequency.

17. The delta-sigma modulator of claim 16, wherein the loop filter comprises a plurality of stages, a first stage of the plurality of stages uses the clock signal having the second frequency, and the following stages use the clock signal having the first frequency.

* * * * *